(12) United States Patent
Zakhidov et al.

(10) Patent No.: US 7,718,230 B2
(45) Date of Patent: May 18, 2010

(54) METHOD AND APPARATUS FOR TRANSFERRING AN ARRAY OF ORIENTED CARBON NANOTUBES

(75) Inventors: Anvar A. Zakhidov, McKinney, TX (US); Rashmi Nanjundaswamy, Dallas, TX (US); Sergey Li, Dallas, TX (US); Alexander Zakhidov, Moscow (RU); Mei Zhang, Plano, TX (US); Ray H. Baughman, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1161 days.

(21) Appl. No.: 11/271,571

(22) Filed: Nov. 11, 2005

(65) Prior Publication Data

US 2008/0014443 A1    Jan. 17, 2008

Related U.S. Application Data

(60) Provisional application No. 60/626,789, filed on Nov. 11, 2004.

(51) Int. Cl.
*B05D 1/04* (2006.01)
*C01B 31/00* (2006.01)

(52) U.S. Cl. ............... 427/474; 423/447.1; 423/447.2; 423/447.3; 204/173; 977/890

(58) Field of Classification Search ............. 423/447.1, 423/447.2, 447.3; 204/164, 173; 427/457–486
See application file for complete search history.

(56) References Cited

U.S. PATENT DOCUMENTS 6,297,063 B1 * 10/2001 Brown et al. ............... 438/2
6,340,822 B1 * 1/2002 Brown et al. ............... 257/25
7,169,250 B2 * 1/2007 Kim et al. ............... 156/290
2003/0143398 A1 * 7/2003 Ohki et al. ............... 428/398
2006/0103287 A1 * 5/2006 Tsuei ............... 313/311
2008/0213159 A1 * 9/2008 Sandhu ............... 423/447.1

(Continued)

FOREIGN PATENT DOCUMENTS

JP    2001-312953    * 9/2001

(Continued)

OTHER PUBLICATIONS

Chen, et al., Aligning single-wall carbon nanotubes with an alternating-current electric field, Applied Physics Letters 2001; 78(23): 3714-3716.*

(Continued)

*Primary Examiner*—Stanley S. Silverman
*Assistant Examiner*—Daniel C. McCracken
(74) *Attorney, Agent, or Firm*—Daniel J. Chalker; Edwin S. Flores; Chalker Flores, LLP

(57) ABSTRACT

The present invention provides a method and apparatus for transferring an array of oriented carbon nanotubes from a first surface to a second surface by providing the array of oriented carbon nanotubes on the first surface within a vacuum chamber, providing the second surface within the vacuum chamber separate from the first surface, and applying an electric potential between the first surface and the second surface such that the array of oriented carbon nanotubes are sublimed from the first surface and re-deposited on the second surface.

56 Claims, 15 Drawing Sheets

U.S. PATENT DOCUMENTS

2009/0304945 A1* 12/2009 Brown et al. ............... 427/462

OTHER PUBLICATIONS

Ural, et al., Electric-field-aligned growth of signle-walled carbon nanotubes on surfaces, Applied Physics Letters 2002; 81(18): 3464-3466.*

Journet, et al., Production of carbon nanotubes, Appl. Phys. A 1998; 67: 1.*

Huang, et al., Patterned Growth and Contact Transfer of Well-Aligned Carbon Nanotube Films, J. Phys. Chem. B. 1999; 103: 4223-4227.*

Nanjundaswamy, et al., Light Emission from Carbon Nanotubes Induced by Field Electron Emission from Oriented MWCNT Arrays Accompanied by Re-Deposition, Mater. Res. Soc. Symp. Proc. vol. 858E, pp. HH13.5.1 © 2005.*

Materials Research Society website 2004 Fall Symposium HH—1 page.*

Dai, Carbon Nanotubes: Synthesis, Integration, and Properties, Acc. Chem. Res. 2002; 35: 1035-1044.*

* cited by examiner

Nanotubes on Anode after Transfer

Substrate after Transfer

Fig. 10B
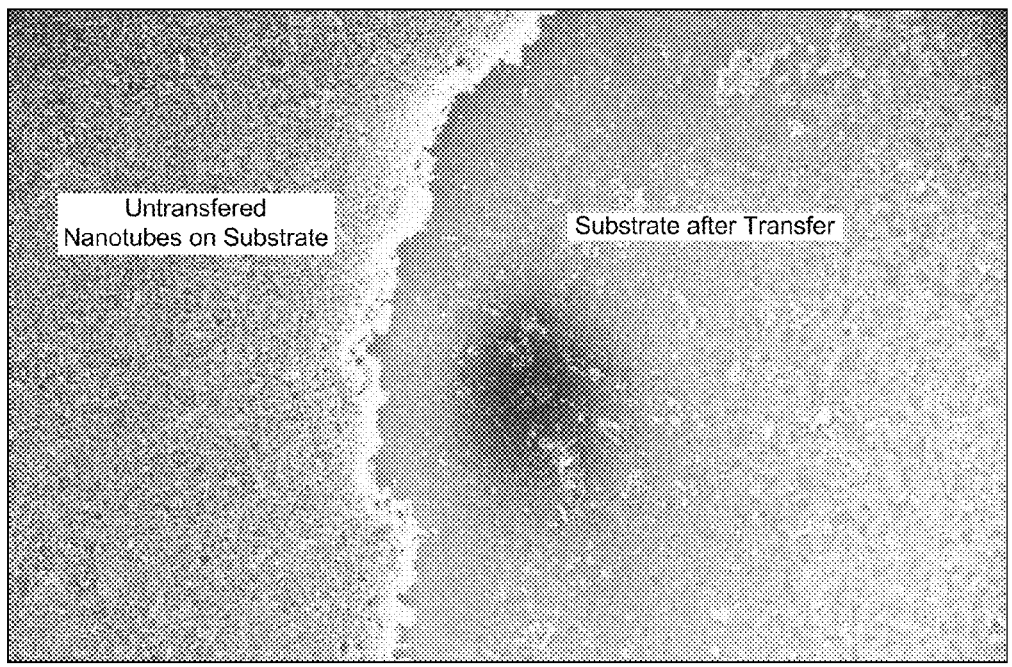
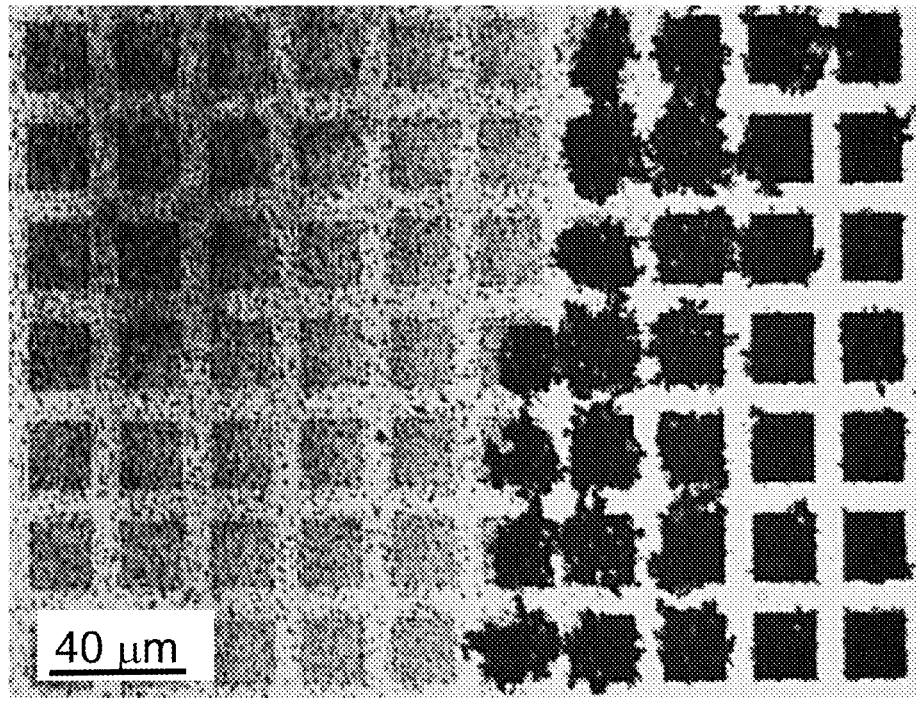
Fig. 11

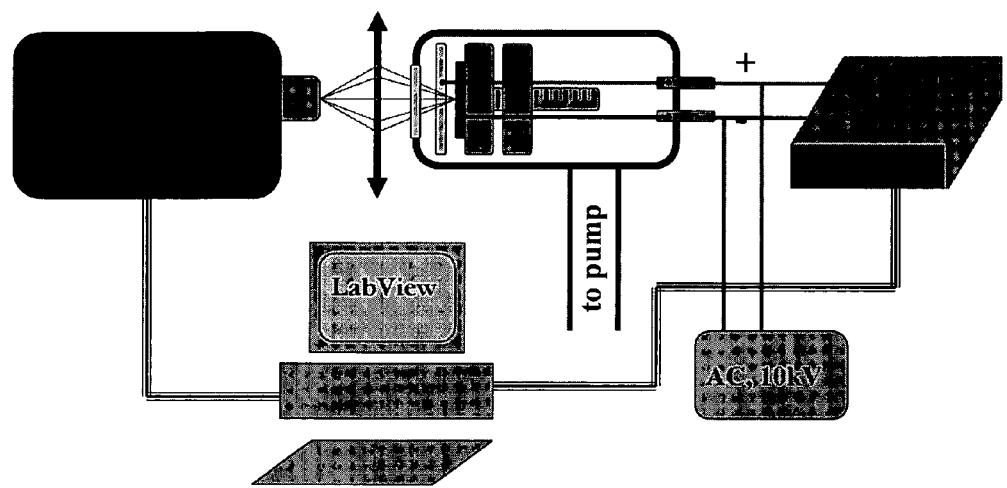
Fig. 16
 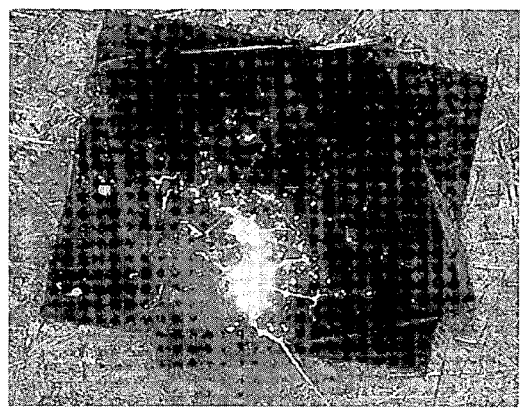
Fig. 17A                    Fig. 17B

METHOD AND APPARATUS FOR TRANSFERRING AN ARRAY OF ORIENTED CARBON NANOTUBES

REFERENCE TO RELATED APPLICATIONS

This application claims priority to U.S. Provisional Patent Application No. 60/626,789 filed Nov. 11, 2004 entitled Method and Apparatus for Transferring an Array of Oriented Carbon Nanotubes, which is herein incorporated by reference in its entirety.

U.S. GOVERNMENT RIGHTS

The U.S. Government may own certain rights in this invention pursuant to the terms of the U.S. Air Force Office of Scientific Research Grant No. F 49620-03-1-0164.

FIELD OF THE INVENTION

The present invention relates generally to the field of nanotechnology and, more particularly, to a method and apparatus for transferring an array of oriented carbon nanotubes.

BACKGROUND OF THE INVENTION

Aligned multiwalled carbon nanotubes (MWNT) are most commonly grown using chemical vapor deposition (CVD). This method, however, has a serious drawback: aligned MWNTs can only be grown only on certain materials because of the high temperature at which the growth takes place (about 700° C.). As a result, current technology does not allow patterned aligned MWNT to be grown on any type of substrate. For example, it is not possible to grow nanotubes by an acetylene-based CVD process on metals that have low melting temperatures (e.g., Al, Pb, etc.) or metals that react with acetylene (e.g., Cu, etc.).

Another known method of growing aligned MWNT is the electrophoretic method, which is a cold cathode fabrication process further described in Y. Nakayam, S. Akita, Synth. Met. 117 (2001) 207-210. MWNTs produced in this manner have limited application because of the weak adhesion of the carbon powder to the substrate. Other processes may include the arc discharge method or microwave plasma deposition method.

Ink-jet or screen printing of patterned cold emitters is another fabrication method, which involves the printing of specially formulated inks having conducting or semiconducting particles in an insulating matrix. The application of this method is hindered because the printable field emitters produced by this method have high threshold voltages (~20 V $\mu m^{-1}$) and require special conditioning procedures to obtain uniform electron emission at sufficiently low fields.

Field electron emission (FE) from MWNT has become a widely known phenomenon since the discovery of nanotubes in 1991. Field emitters comprising aligned arrays of MWNTs have higher current densities and a better stability over long duration of time as compared to conventional field emitters. Moreover, there are no methods and processes capable to transfer matter in high vacuum while retaining the pattern and preferential orientation of the matter without using complicated multi-step lithographic processes involving masks, stamps and/or pre-patterned substrate preparations.

Different techniques have been proposed for improvement of mechanical properties of carbon nanotube emitters, such as embedding the bottom part of vertically aligned carbon nanotubes into a $SiO_2$ film or burying nanotubes in a polymer matrix. However, these techniques only improve mechanical contact, but they do not decrease electrical and thermal resistance of the contacts, which are the critical parameters for applications based on vertical geometry such as cold field emitter, nanoelectrode arrays for chemical and biosensors and vertical nanotransistors.

There is, therefore, a need for a method and apparatus for transferring an array of oriented carbon nanotubes having a certain pattern, and improved thermal and electrical characteristics.

SUMMARY OF THE INVENTION

The present invention transfers arrays and patterned arrays of aligned multiwalled carbon nanotubes under high electric field in a high vacuum from one surface to another. Such a transfer of matter in high vacuum over macroscopic distances and subsequent deposition on surfaces while still retaining the pattern and orientation without using mask and pre-patterned substrate was heretofore unknown. Note that the matter transfer described herein is not merely the transfer of single ions or molecules, but is the transfer of nano size structures made of huge number of atoms. Such sublimation is accompanied by field electron emission and spark light emission from nanotubes. Since the tubes fly through the separation between the substrate (cathode) and the anode through high electric field, the tubes carry a lot of kinetic energy and when the tubes are re-deposited onto the anode, the adhesion between the re-deposited tubes and the anode is stronger than the original adhesion of the tubes and the cathode substrate. In addition, sublimation onto anodes made of different materials can be achieved. Thus, the present invention's method and apparatus to transfer nanotubes onto any material or substrate by the application of an electric field is not only simple but is also highly effective.

Furthermore, the present invention allows the making of more sharp and precise patterns or creating new patterns (different from original pattern on the cathode) on the anode and thus obtaining clean patterns on the anode by coating an insulating anode surface with a conductive material in the specific places. For example, the pattern can be reinforced by making the conductive material on the anode (gold, ITO, etc. on glass) in patterns. Since the tubes will only stick on the surface that has a layer of conducting material, this method can be used to make clean patterns on the anode.

The present invention can be used to produce inexpensive gated field emission arrays by depositing aligned carbon nanotubes onto patterned substrate with gates. The invention solves the serious technological problem of growing CNT in deep wells of field emitter arrays or avoids the difficulties of anisotropic etching of conventional tip geometry. In addition, the present invention produces patterned aligned carbon nanotube field emitters having order-of-magnitude higher electrical, thermal and mechanical properties. For example, the following characteristics can be achieved: (1) increase the thermal conductivity from 10 W/mK to 200 W/mK, which is close to the thermal conductivity of metals (KCu=398 W/mK); and (2) increase the electrical conductivity from 10 S/cm to 100+ S/cm. The resulting nanotubes can be used in displays, atomic/ionic microscopes, lasers, etc.

More specifically, the present invention provides a method for transferring an array of oriented carbon nanotubes from a first surface to a second surface by providing the array of oriented carbon nanotubes on the first surface within a vacuum chamber, providing the second surface within the vacuum chamber separate from the first surface, and applying an electric potential between the first surface and the second surface such that the array of oriented carbon nanotubes are sublimed from the first surface and re-deposited on the second surface accompanied by field emission.

Accordingly, the present invention provides an array of oriented carbon nanotubes on a substrate made in accordance with the method described above. Likewise, the present invention provides an array of oriented carbon nanotubes disposed on a metallic substrate having a low melting point or that is reactive with acetylene or other reactive gases using in CVD processes. The present invention also provides an array of oriented carbon nanotubes disposed on a substrate, having a resistance on the order of 3-4Ω, an electrical conductivity greater than 100 S/cm, and a thermal conductivity greater than 100 W/mK.

Alternatively, the method may include providing a third surface such that the second surface is disposed between the first surface and the third surface and wherein the second surface is porous such that the array of oriented carbon nanotubes are sublimed from the first surface, pass substantially through the second surface and are re-deposited on the third surface. The third surface can be in physical contact with the second surface or separate from the second surface. The second surface can be a wire mesh, one or more wires, one or more strips, a solid surface having one or more apertures, or other conducting material with windows that will produce the desired pattern of oriented carbon nanotubes on the third surface.

In addition, the present invention provides an apparatus for creating a patterned array of oriented carbon nanotubes on a substrate that includes a vacuum chamber, a first surface and second surface disposed within the vacuum chamber, a power source external to the vacuum chamber for providing an electric potential to the first surface and the second surface, the first surface having an array of oriented carbon nanotubes disposed thereon, the second surface mounted on the anode separate from and parallel with the first surface, and a controller connected to the vacuum chamber and the power source for applying the electric potential between the first surface and the second surface such that the array of oriented carbon nanotubes are sublimed and re-deposited on the second surface.

Alternatively, the apparatus may include a third surface such that the second surface is disposed between the first surface and the third surface and wherein the second surface is porous such that the array of oriented carbon nanotubes are sublimed from the first surface, pass substantially through the second surface and are re-deposited on the third surface. The third surface can be in physical contact with the second surface or separate from the second surface. The second surface can be a wire mesh, one or more wires, one or more strips, a solid surface having one or more apertures, or other conducting material that will produce the desired pattern of oriented carbon nanotubes on the third surface.

Other features and advantages of the present invention will be apparent to those of ordinary skill in the art upon reference to the following detailed description taken in conjunction with the accompanying drawings.

BRIEF DESCRIPTION OF THE DRAWINGS

The above and further advantages of the invention may be better understood by referring to the following description in conjunction with the accompanying drawings, in which:

The above and further advantages of the invention may be better understood by referring to the following description in conjunction with the accompanying drawings, in which:

FIGS. 10A and 10B are SEM images of the nanotubes on the cathode after complete transfer (FIG. 10A) and partial transfer (FIG. 10B) in accordance with the present invention;

FIG. 11 is an optical microscope image of the anode after the transfer in accordance with the present invention;

FIG. 16 is a schematic of the complete setup in which pattern transfer of nanotubes was carried out in accordance with the present invention;

FIGS. 17A and 17B are photographs showing the spark emission in accordance with the present invention;

DETAILED DESCRIPTION OF THE INVENTION

Figure 1A:
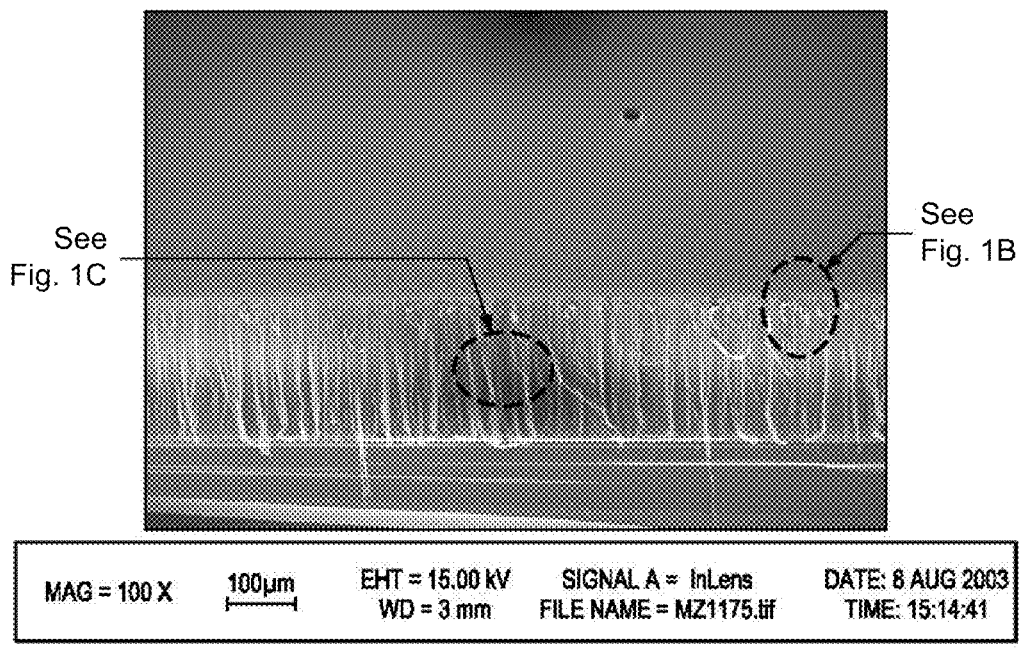
FIGS. 1A-1D are SEM images showing four views of a vertically aligned multi walled carbon nanotube sample in accordance with the present invention.
Figure 1B:
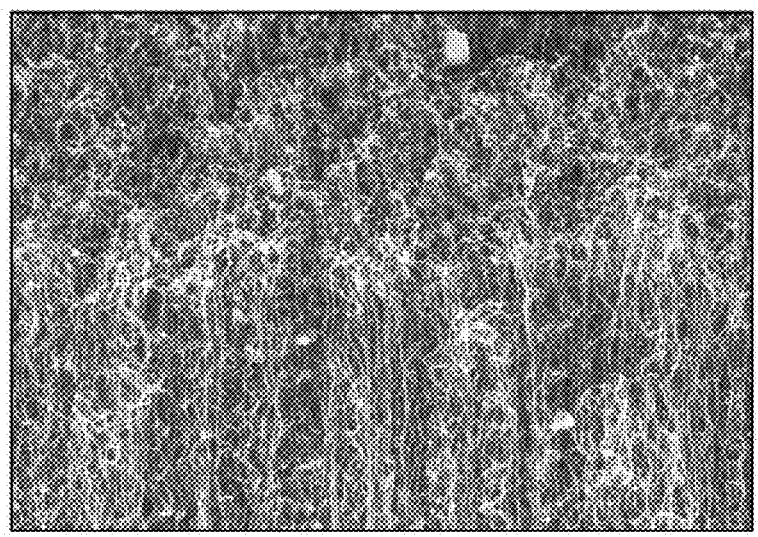
Figure 1C:
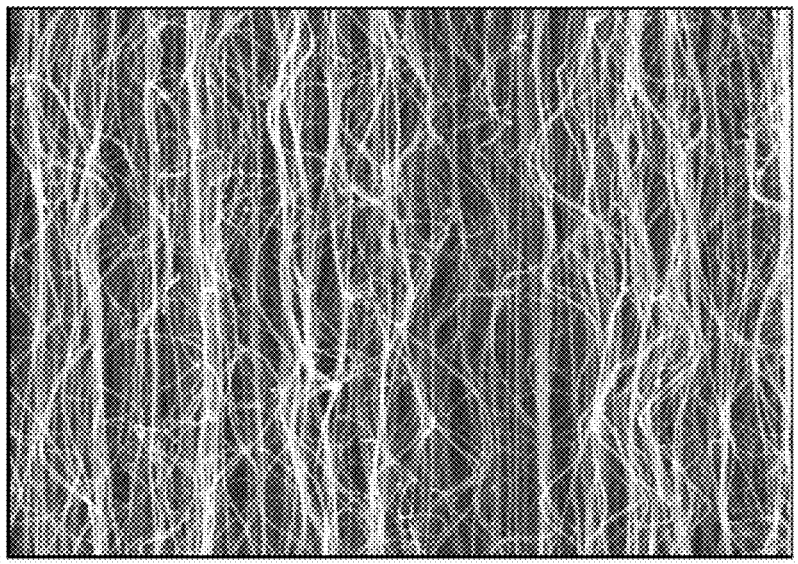
Figure 1D:
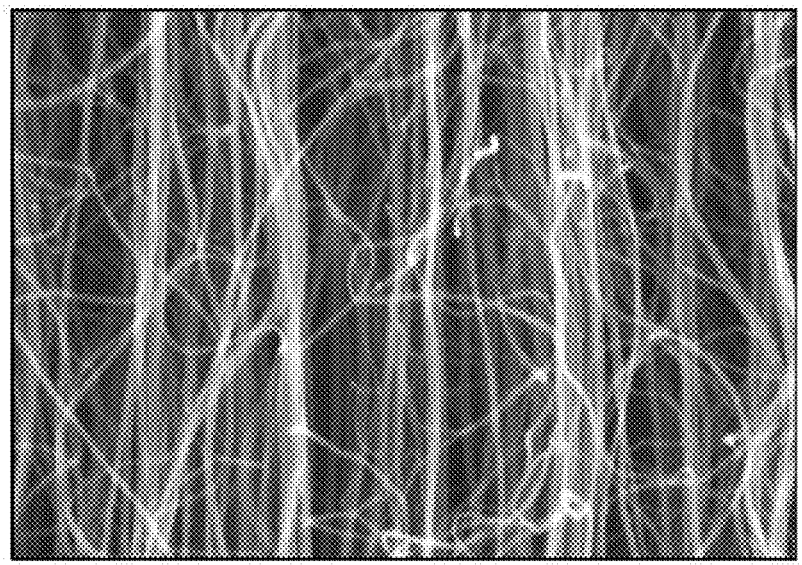

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

The present invention transfers arrays and patterned arrays of aligned multiwalled carbon nanotubes under high electric field in a high vacuum from one surface to another. Such a transfer of matter in high vacuum over macroscopic distances and subsequent deposition on surfaces while still retaining the pattern and orientation without using mask and pre-patterned substrate was heretofore unknown. Note that the matter transfer described herein is not merely the transfer of ions or molecules, but is the transfer of nano size structures. Such sublimation is accompanied by field electron emission and caused by spark light emission as shown in FIGS. 17A and 17B. Since the tubes fly through the separation between the substrate (cathode) and the anode through high electric field, the tubes carry a lot of energy and when the tubes are re-deposited onto the anode, the adhesion between the re-deposited tubes and the anode is stronger than the original adhesion of the tubes and the cathode substrate. In addition, sublimation onto anodes made of different materials can be achieved. Thus, the present invention's method and apparatus to transfer nanotubes onto any material or substrate by the application of an electric field is not only simple but is also highly effective.

Furthermore, the present invention allows the making of more sharp and precise patterns or creating new patterns (different from original pattern on the cathode) on the anode and thus obtaining clean patterns on the anode by coating an insulating anode surface with a conductive material in the specific places. For example, the pattern can be reinforced by making the conductive material on the anode (gold, ITO, etc. on glass) in patterns. Since the tubes will only stick on the surface that has a layer of conducting material, this method can be used to make clean patterns on the anode.

The present invention can be used to produce inexpensive gated field emission arrays by depositing aligned carbon nanotubes onto patterned substrate with gates. The invention solves the serious technological problem of growing CNT in deep wells of field emitter arrays or avoids the difficulties of anisotropic etching of conventional tip geometry. In addition, the present invention produces patterned aligned carbon nanotube field emitters having order-of-magnitude higher electrical, thermal and mechanical properties. For example, the following characteristics can be achieved: (1) increase the thermal conductivity from 10 W/mK to 200 W/mK, which is close to the thermal conductivity of metals (KCu=398 W/mK); and (2) increase the electrical conductivity from 10 S/cm to 100+ S/cm. The resulting nanotubes can be used in displays, atomic/ionic microscopes, lasers, etc.

Figure 2A:
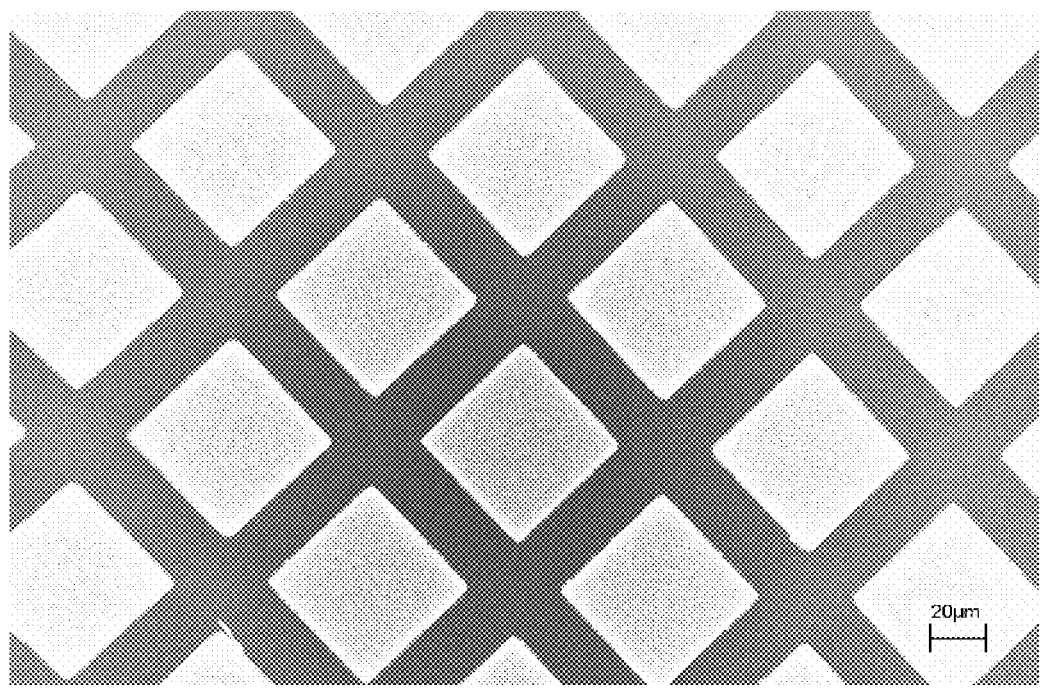
FIGS. 2A and 2B are SEM images of a patterned multi walled carbon nanotube sample grown on a doped silicon substrate at two different magnifications (A—304X and B—1.26KX) in accordance with the present invention.
Figure 2B:
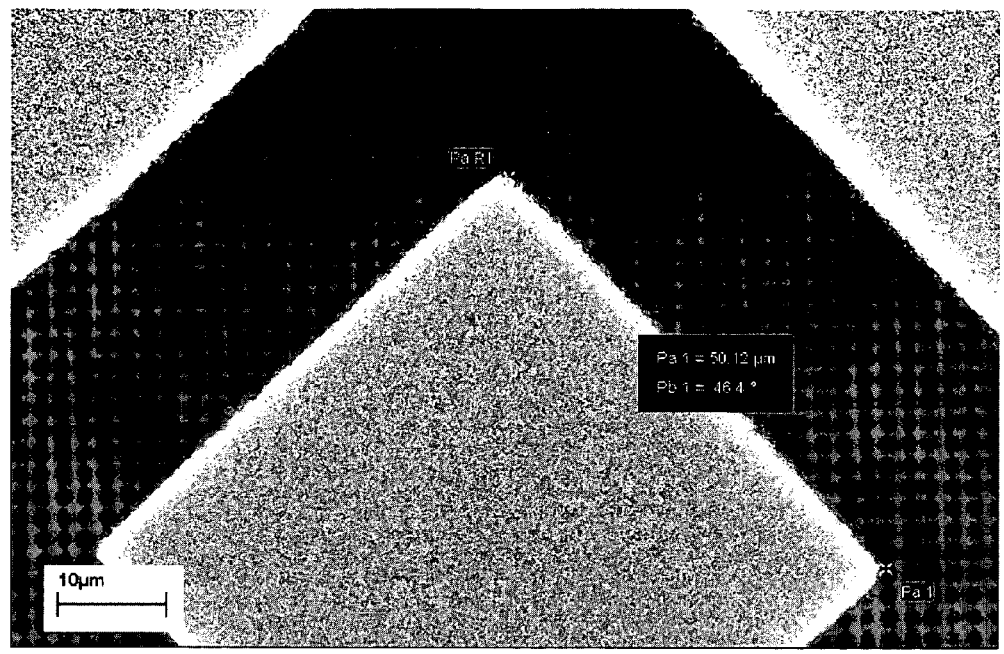

FIGS. 1A-1D are SEM images showing four views of a vertically aligned multi walled carbon nanotube sample in accordance with the present invention. The carbon nanotubes typically have a length between 20 and 400 microns, but many applications use lengths of between 50 and 200 microns. The carbon nanotubes typically have a diameter between 5 and 30 nanometers, but many applications use diameters of between 10 and 20 nanometers. The carbon nanotubes typically have a wall thickness between 2 and 20 nanometers. For example, FIG. 2 is a TEM image of a multi walled carbon nanotube in accordance with the present invention. In addition, the carbon nanotubes typically have a thermal conductivity greater than 10 W/mK, e.g., between 100 W/mK and 3000 W/mK. Similarly, the carbon nanotubes typically have an electrical conductivity greater than 100 S/cm.

Figure 3:
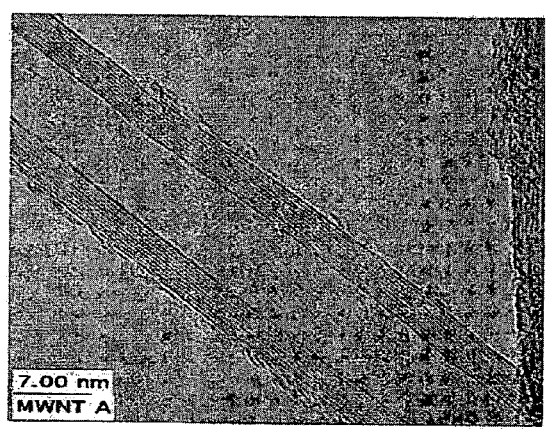
FIG. 3 is a TEM image of a multi walled carbon nanotube in accordance with the present invention.

FIG. 3 is a SEM image of a patterned multi walled carbon nanotube sample grown on a doped silicon substrate in accordance with the present invention. The array of oriented carbon nanotubes can form one or more patterns on the first surface. For example, the pattern can be formed by two or more arrays of oriented carbon nanotubes having a spacing of between 25 microns and 250 microns. The pattern may include one or more addressable targets. The pattern on the first surface is substantially duplicated on the second surface after the carbon nanotubes are sublimed from the first surface and re-deposited on the second surface. The pattern can be substantially duplicated without using a mask or a pre-patterned substrate.

Figure 4:
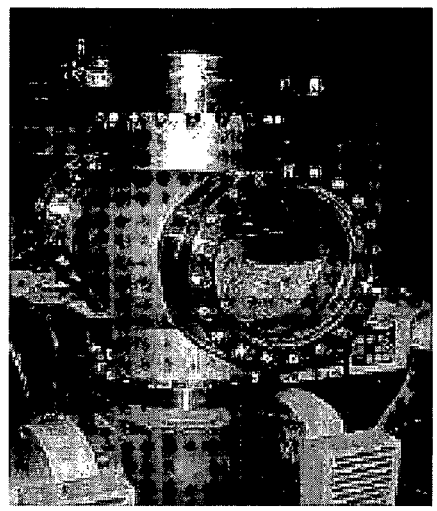
FIG. 4 is photograph of the vacuum chamber in which the sample (cathode) and the anode was mounted in accordance with the present invention.
Figure 5A:
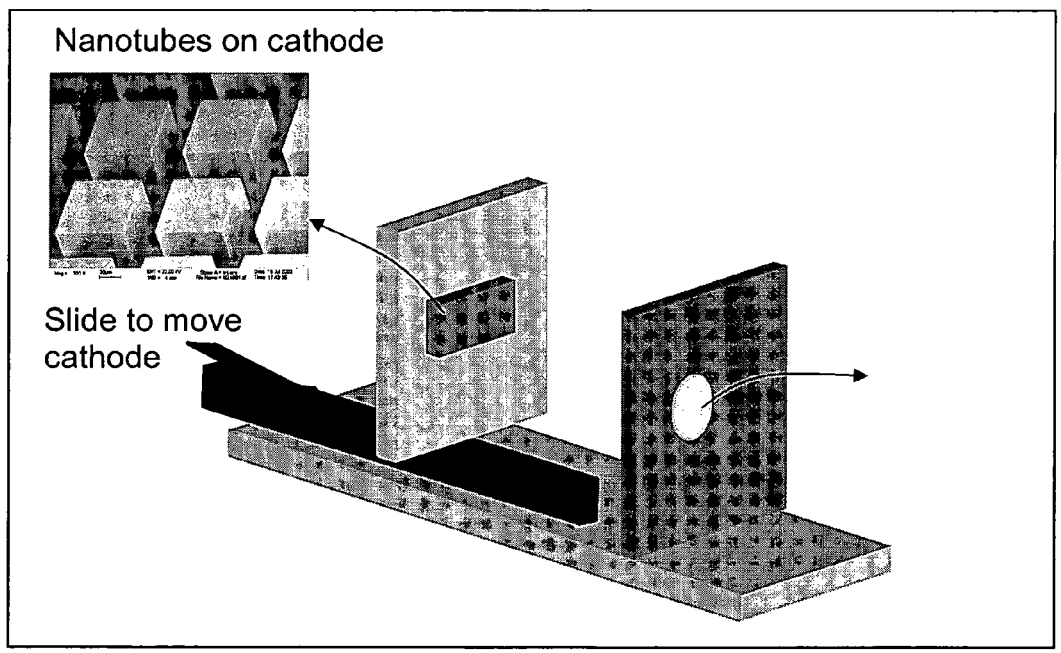
FIGS. 5A and 5B show a schematic representation of the apparatus within the device of FIG. 4 to transfer multi walled carbon nanotubes in accordance with the present invention.
Figure 5B:
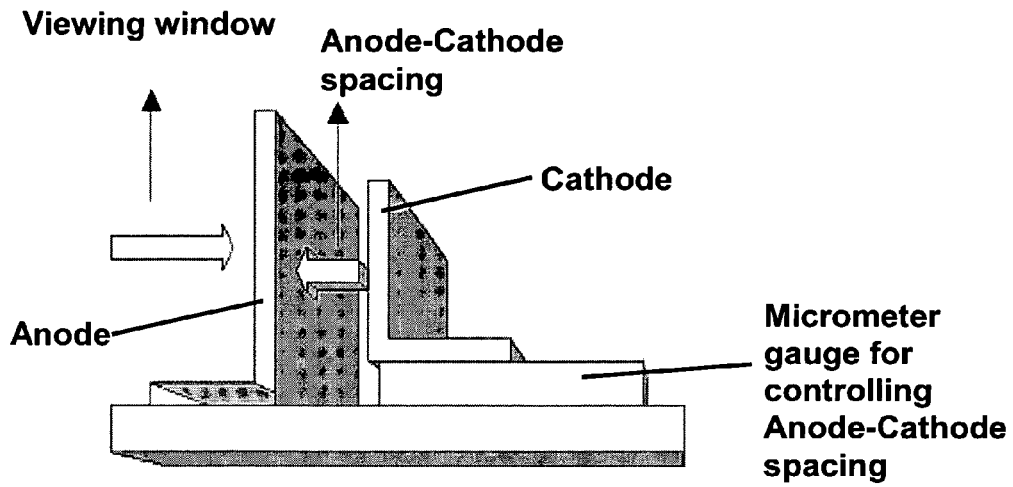

FIG. 4 is photograph of the device on which the sample (cathode) and the anode are mounted in accordance with the present invention. FIGS. 5A and 5B show a schematic representation of the apparatus within the device of FIG. 4 to transfer multi walled carbon nanotubes in accordance with the present invention. More specifically, the present invention provides a method for transferring an array of oriented carbon nanotubes from a first surface to a second surface by providing the array of oriented carbon nanotubes on the first surface within a vacuum chamber, providing the second surface within the vacuum chamber separate from the first surface, and applying an electric potential between the first surface and the second surface such that the array of oriented carbon nanotubes are sublimed from the first surface and re-deposited on the second surface accompanied by field emission. This process is illustrated in FIG. 6 (setup before pattern transfer of the nanotubes), FIG. 7 (setup during and after pattern transfer of the nanotubes), and FIG. 8 (actual process of transfer).

Figure 6:
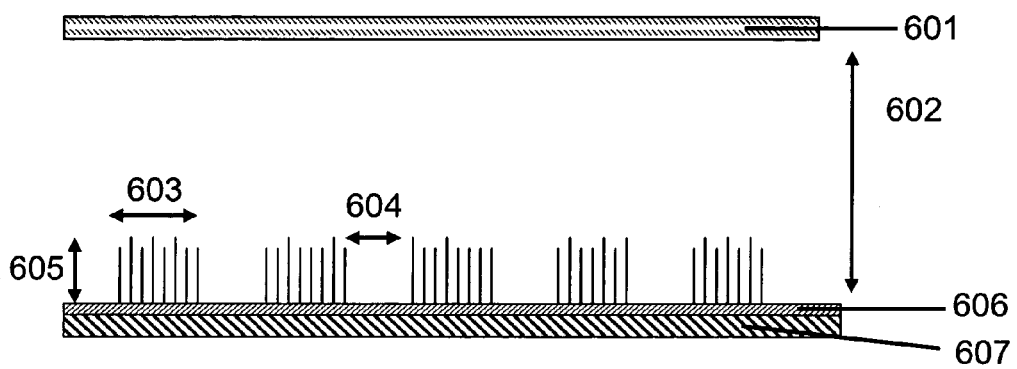
FIG. 6 shows the schematic representation of the setup before pattern transfer of the nanotubes in accordance with the present invention.

As shown in FIG. 6, a transparent glass 601 is coated with nonconducting material such as Organic AlQ3 (Anode). The anode-cathode spacing 602 is between 0-500 μm. The size of the nanotube pattern 603 is between 50-300 μm and the space 604 between the nanotube patterns is between 25-250 μm. The height 605 of nanotube pattern is between 50-400 μm. The nanotube patterns are grown on catalyst layer 606, which is on a doped silicon substrate (Cathode) 607. A conducting grid/mesh can be used to create patterns on nonconducting anode 601.

Figure 7:
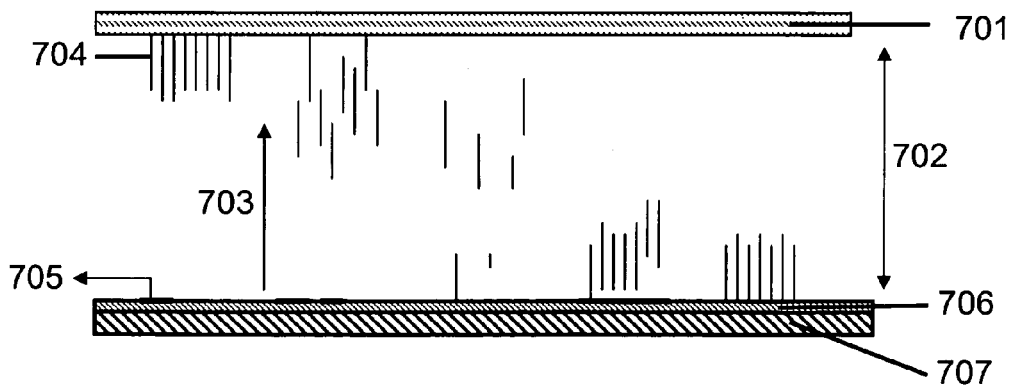
FIG. 7 shows the schematic representation of the setup during and after pattern transfer of the nanotubes in accordance with the present invention.
Figure 8:
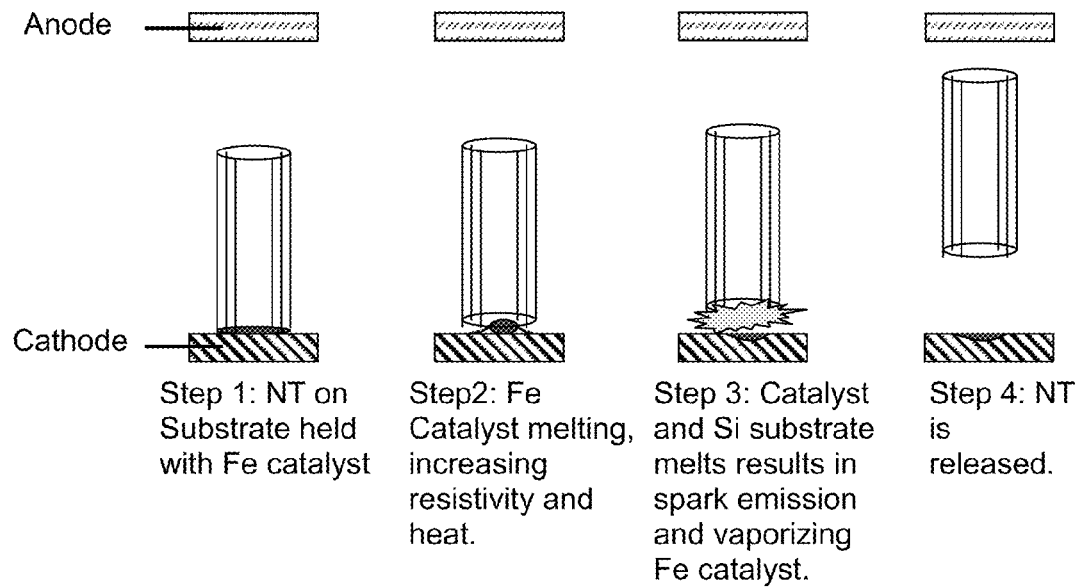
FIG. 8 is the schematic representation of the actual process of transfer in accordance with the present invention.

Now referring to FIGS. 7 and 8, the transfer process is illustrated. In step 1, the nanotubes are held on substrate 707 (cathode) with a Fe catalyst 706. In step 2, the Fe catalyst 706 melts, increasing resistivity and heat. In step 3, the catalyst 706 and Si substrate 707 melt resulting in spark emission and vaporization of the Fe catalyst 706. In step 4, the nanotubes are released (represented by arrow 703). The nanotubes traverse the anode-cathode spacing 702 and embed themselves in the anode 701 as represented by embedded nanotubes 704 and space 705.

Accordingly, the present invention provides an array of oriented carbon nanotubes on a substrate made in accordance with the method described above. Likewise, the present invention provides an array of oriented carbon nanotubes disposed on a metallic substrate having a low melting point or that is reactive with acetylene. The present invention also provides an array of oriented carbon nanotubes disposed on a substrate, having a resistance on the order of 3-4Ω, an electrical conductivity greater than 100 S/cm, and a thermal conductivity greater than 100 W/mK.

Figure 9A:
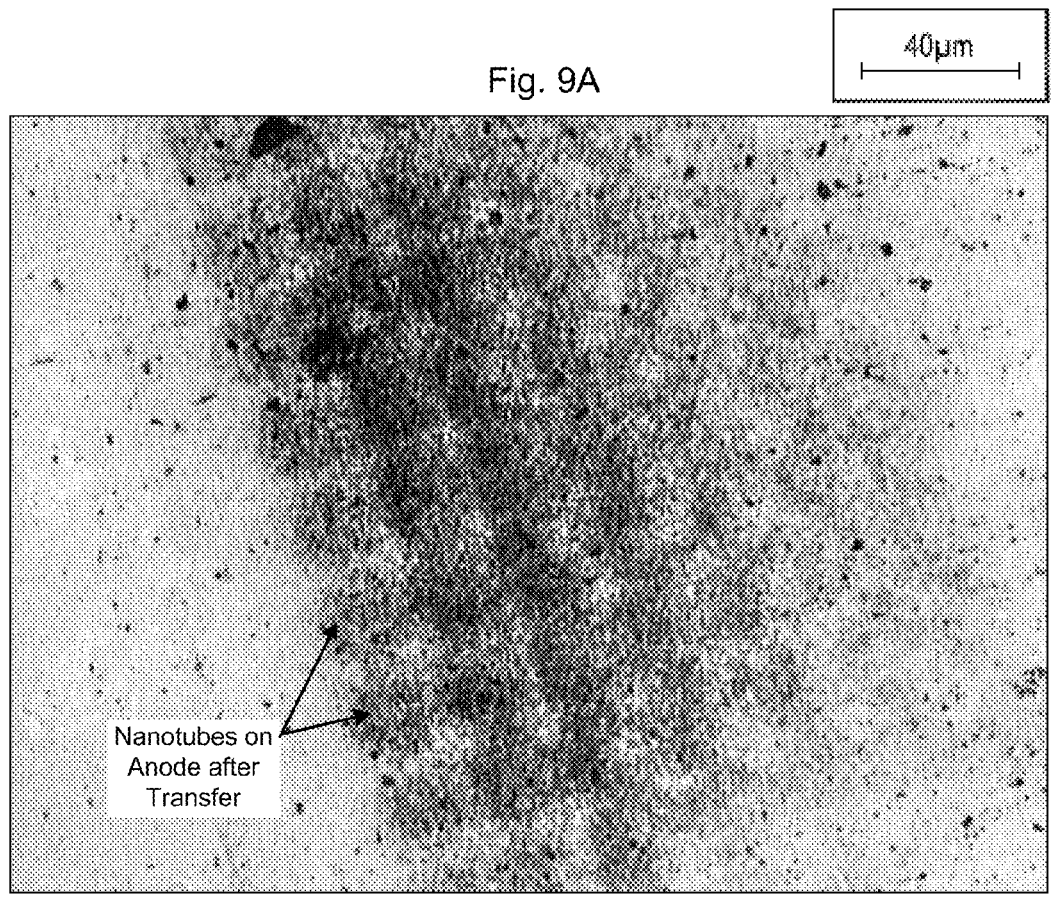
FIGS. 9A and 9B are optical microscope images of the nanotubes on the anode after the transfer in accordance with the present invention.
Figure 9B:
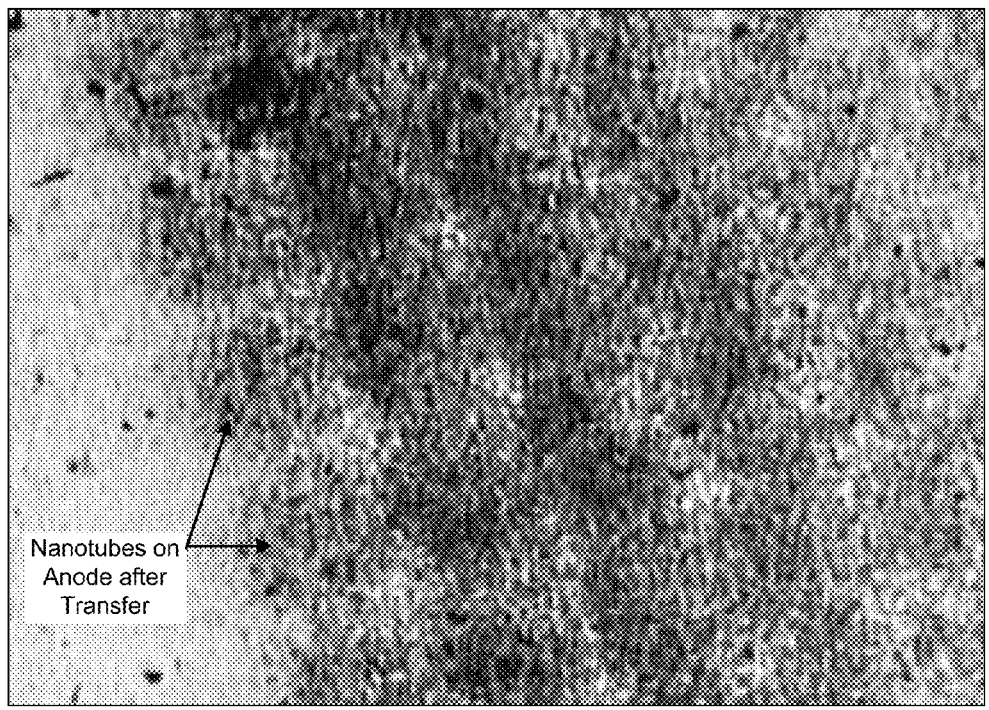
Figure 10A:
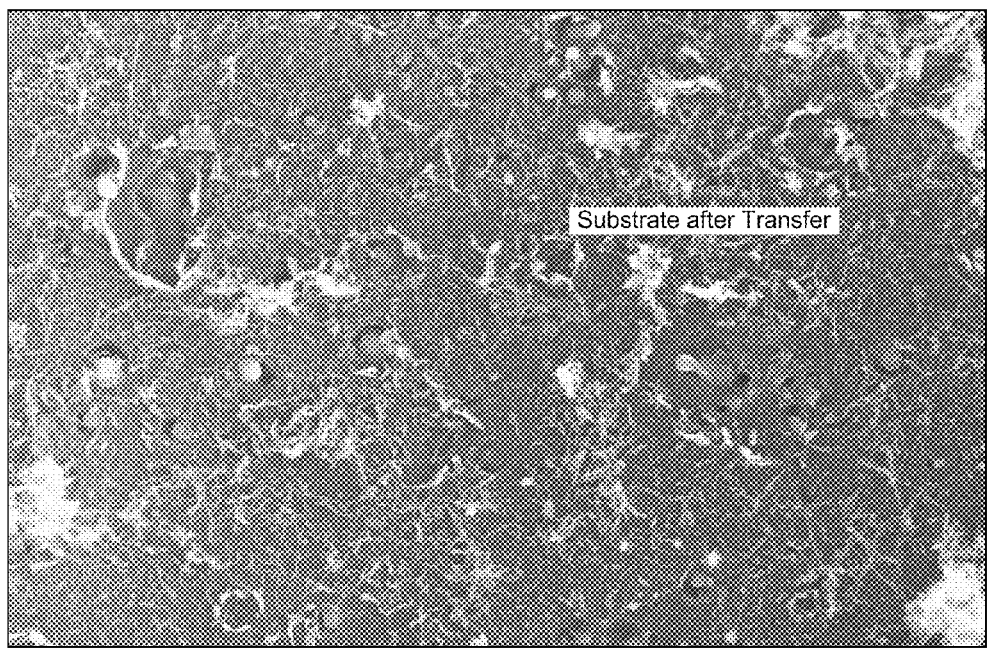
Figure 12A:
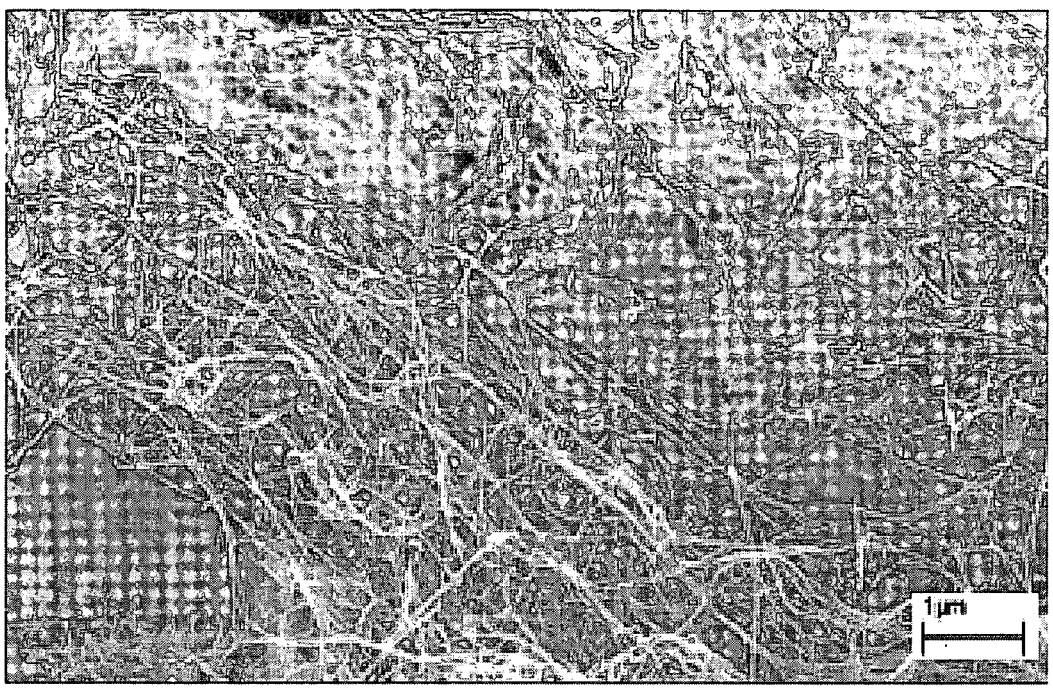
FIGS. 12A and 12B are SEM images of the cathode after the transfer in accordance with the present invention.
Figure 12B:
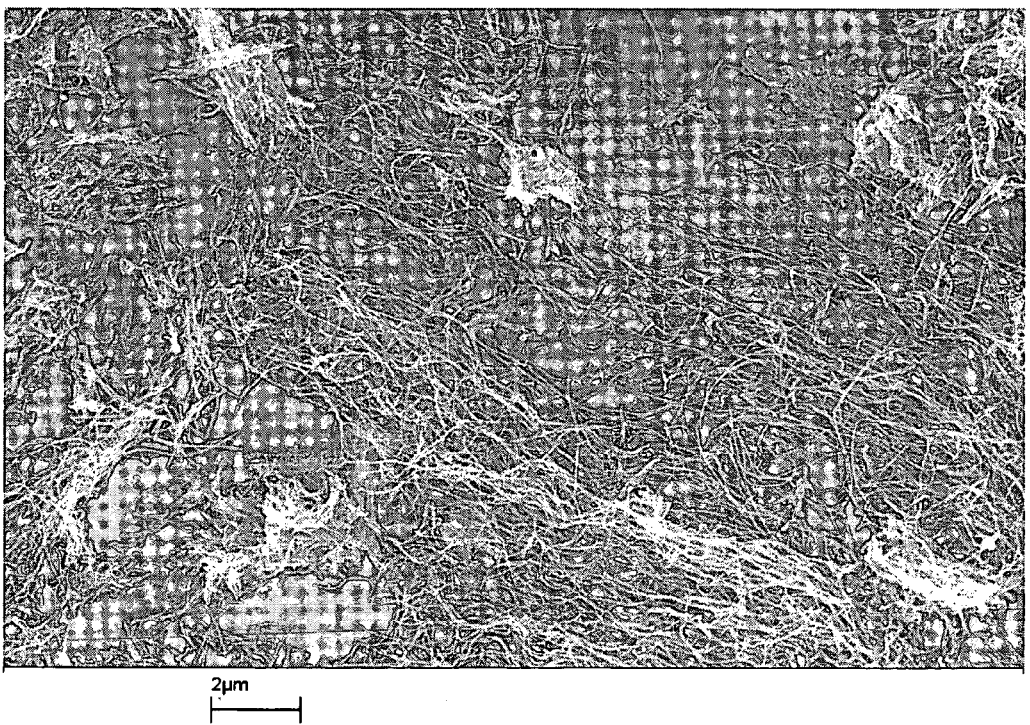
Figure 13A:
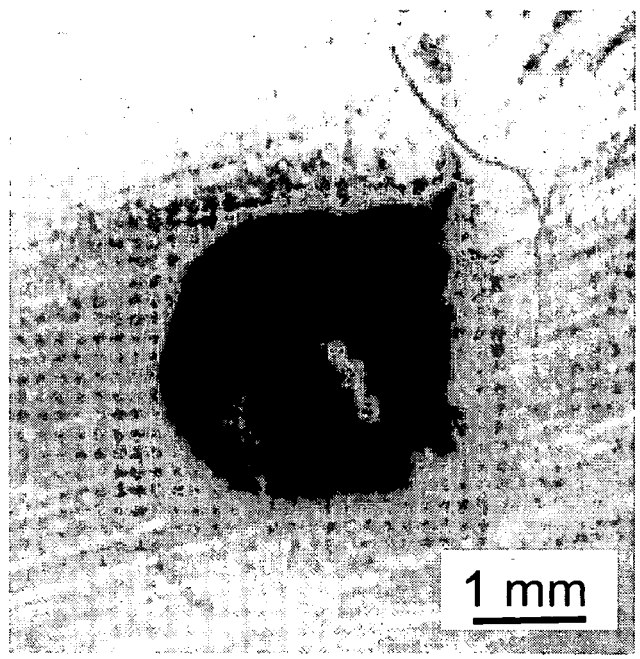
FIG. 13A is a photograph of nanotubes that have been transferred to a copper substrate in accordance with the present invention.
Figure 13B:
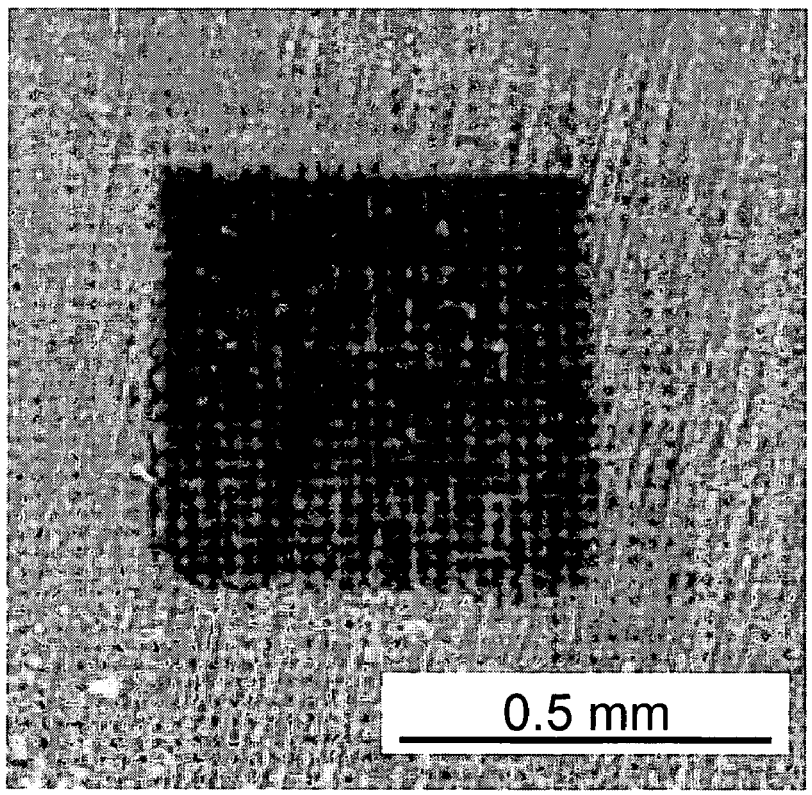
FIG. 13B is a photograph of nanotubes that have been transferred to an aluminum substrate in accordance with the present invention.

The array of oriented carbon nanotubes are sublimed when the field emitted electron flow through the carbon nanotubes reaches a threshold current, which can be between 0.3 mA/cm$^2$ to 10 mA/cm$^2$, depending on the cathode-anode spacing and other parameters. The threshold current can be an alternating current (AC), which can be adjusted, or a direct current (DC). The electric field is created by the electric potential between the first surface and the second surface, which is pulsed when AC is used. For example, FIGS. 9A and 9B are optical microscope images of the nanotubes on the anode after the transfer in accordance with the present invention. FIGS. 10A and 10B are SEM images of the nanotubes on the anode after the transfer in accordance with the present invention. FIG. 11 is an optical microscope image of the cathode after the transfer in accordance with the present invention. FIGS. 12A and 12B are SEM images of the cathode after the transfer in accordance with the present invention. FIG. 13A is a photograph of nanotubes that have been transferred to a copper substrate in accordance with the present invention. FIG. 13B is a photograph of nanotubes that have been transferred to an aluminum substrate in accordance with the present invention.

Figure 14:
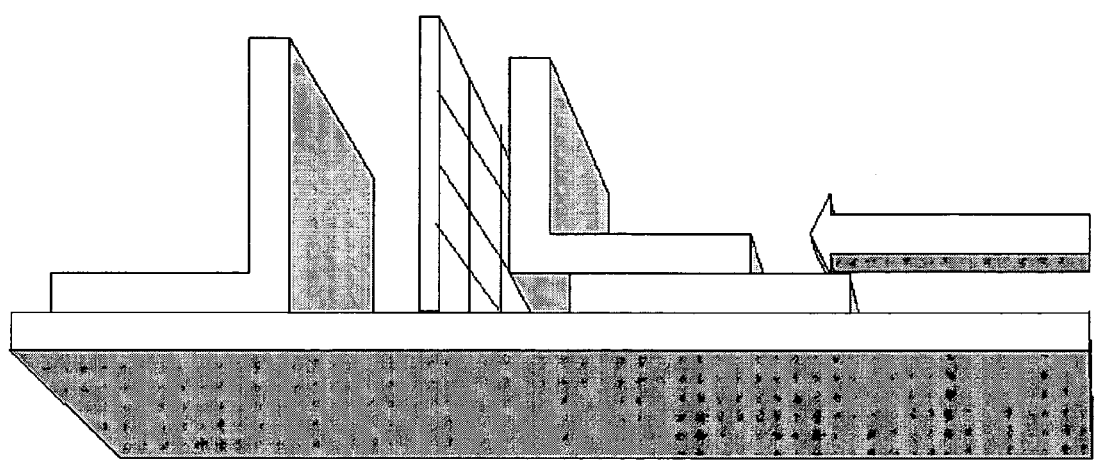
FIG. 14 shows a schematic representation of the apparatus within the device of FIG. 4 to transfer multi walled carbon nanotubes in accordance with another embodiment of the present invention.
Figure 15:
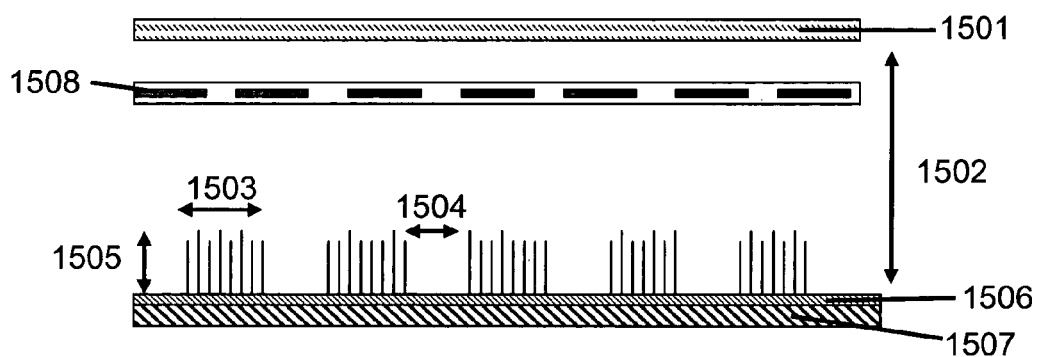
FIG. 15 shows the schematic representation of the setup before pattern transfer of the nanotubes using the apparatus of FIG. 14 in accordance with the present invention.

FIG. 14 shows a schematic representation of the apparatus within the device of FIG. 4 to transfer multi walled carbon nanotubes in accordance with another embodiment of the present invention. FIG. 15 shows the schematic representation of the setup before pattern transfer of the nanotubes using the apparatus of FIG. 14 in accordance with the present invention. In accordance with FIGS. 14 and 15, the method may include providing a third surface 1501 such that the second surface 1508 is disposed between the first surface 1506, 1507 and the third surface 1501 and wherein the second surface 1508 is porous such that the array of oriented carbon nanotubes are sublimed from the first surface 1506, 1507, pass substantially through openings within the second surface 1508 and are re-deposited on the third surface 1501. The third surface 1501 can be in physical contact with the second surface 1508 or separate from the second surface 1508. The second surface 1508 can be a wire mesh, one or more wires, one or more strips, a solid surface having one or more apertures, or other conducting material that will produce the desired pattern of oriented carbon nanotubes on the third surface 1501. The nanotube patterns have a width 1503, a gap 1504 and a height 1505. The anode-cathode spacing is 1502.

The electric potential is applied to form an electrical field that causes the field electron emission from nanotubes on a first surface, creates a force that moves departed tubes and assists the array of oriented carbon nanotubes to form a pattern on the second surface. The adhesion of the re-deposited carbon nanotubes on the second surface typically exceeds the adhesion of the carbon nanotubes on the first surface. Typically, the electrical resistance of the re-deposited carbon nanotubes on the second surface is on the order of 3-4Ω.

The first surface and the second surface can be oriented vertically, substantially planar, non-planar, substantially perpendicular to one another, not perpendicular to one another, or any desirable configuration. The first surface and the second surface are typically separated by a distance of between 10 and 500 microns. The separation between the first surface and the second surface can be adjusted to fit the application. In addition, the surfaces are not limited to planar surfaces, e.g., the first surface is a cylinder and the second surface is a target disposed within the cylinder.

The first surface is typically a metallic cathode and the second surface is typically a metallic anode, or other materials that can be electrically conductive, such as aluminum. The second surface may include gold, indium tin oxide coated glass or fluorinated tin oxide coated glass. The second surface may also be a metallic substrate or film having a low melting temperature (less than or equal to 700° C.), such as aluminum or lead. In fact, the second surface can have a melting temperature of less than 200 to 300° C. The second surface can also be a metallic substrate that is reactive with acetylene, such as bronze, copper or a metal alloy. In addition, the second surface may include one or more areas of conductive material and one or more areas of non-conductive material such that the areas of conductive material form a pattern. The first surface may include a first pattern while the second surface includes a second pattern. The first pattern can differ from the second pattern.

The array of oriented carbon nanotubes can be grown on the first surface using any desired process, such as a catalytic thermal chemical vapor deposition process. The array of oriented carbon nanotubes can be re-deposited on more than one surface of the target, such as a wire, a second cylinder or a circuit board. As a result, the present invention can be used to form one or more interconnects in an electrical circuit, a portion of a video display, a conductor, a transistor, or a one or more gated field emission arrays, etc. For example, flexible displays can be created without the use of binders is possible because the transfer of nanotubes does not require any adhesive. In addition, the array of oriented carbon nanotubes can be re-deposited to form a dense array of nanotubes from which one or more twist yarns can be spinned, or a dense and long array of nanotubes from which one or more transparent nanotube ribbons and sheets can be drawn. The method of the present invention can be performed a part of a continuous production process.

In addition, the present invention provides an apparatus for creating a patterned array of oriented carbon nanotubes on a substrate that includes a vacuum chamber, a first surface and second surface disposed within the vacuum chamber, a power source external to the vacuum chamber for providing an electric potential to the first surface and the second surface, the first surface having an array of oriented carbon nanotubes disposed thereon, the second surface mounted on the anode separate from and parallel with the first surface, and a controller connected to the vacuum chamber and the power source for applying the electric potential between the first surface and the second surface such that the array of oriented carbon nanotubes are sublimed and re-deposited on the second surface Alternatively, the apparatus may include a third surface such that the second surface is disposed between the first surface and the third surface and wherein the second surface is porous such that the array of oriented carbon nanotubes are sublimed from the first surface, pass substantially through the second surface and are re-deposited on the third surface. The third surface can be in physical contact with the second surface or separate from the second surface. The second surface can be a wire mesh, one or more wires, one or more strips, a solid surface having one or more apertures, or other conducting material that will produce the desired pattern of oriented carbon nanotubes on the third surface.

As demonstrated by the present invention, it is possible to transfer patterned carbon nanotubes under high vacuum from the substrate that they are grown on (the cathode) to the opposite electrode: the plus charged anode. This process takes place only for nanoscale size objects, which have electrical conduction as a result of applying a negative bias to the nanotubes. Upon this voltage the electrons are emitted by electric field enhanced on the tips of tubes and fly in vacuum towards positively charged anode. This electronic phenomenon is well known as field emission. What is new is that above certain threshold current, the carbon nanotubes themselves are sublimed and are re-deposited on the anode. These transferred nanotubes retain the original pattern of nanotubes and their alignment even after being transferred to the anode over the distances of 10 to 500 microns.

Various tests and examples of the present invention will now be described in reference with FIG. 16, which is a schematic of the complete setup in which pattern transfer of nanotubes was carried out in accordance with the present invention. The well-ordered aligned MWNT's were synthesized by the catalytic thermal chemical vapor deposition (CVD) at the atmospheric pressure. The substrates were n++ Silicon (Si) (100) wafers with a resistivity of 0.005 ohm cm. A 5 nm thick Iron (Fe) film was deposited on the Si wafers by electron beam evaporation and patterned lithographically using a lift-off process. The electron beam lithography was used to define the Fe areas. The Fe deposited substrates were placed in the center of a quartz tube (I.D. 45 mm) located in a horizontal tubular electric furnace. The temperature of the substrates was raised at a rate of 15° C./min in a Helium atmosphere. Helium gas of 550 sccm flowed into the quartz tube while the furnace was heated in order to prevent the oxidation of transition metal. After reaching the reaction temperature 680° C., Acetylene gas was introduced into the chamber at the flow rate of 40 sccm. The deposition time was varied from 3 min to 12 min. The length of the carbon nanotubes was adjusted by the variation of the growth time. After the growth process was done, the tube furnace was cooled down to room temperature in Helium ambient.

The field emission measurements of MWNT arrays were performed in $10^{-6}$ Torr vacuum chamber equipped by turbo-molecular pump. A diode setup was used for performing the experiments. An image of the experimental setup, as well as a schematic representation are shown in FIGS. 9A and 9B. The sample is the cathode and the anode is either a glass coated with transparent layer of Indium Tin Oxide (ITO) or a metallic plate with high conductivity, onto which the tubes are to be transferred. Both anode and cathode mounting stands were made aluminum and were hand ground to achieve perfectly parallel surfaces. The anode mounting stand was fixed on a slide and a micrometer gauge was used for adjusting the anode cathode spacing from outside the chamber. Labview program in conjunction with Keithly 237, a high voltage source measure unit was used for making all the measurements. Raman characterization was performed pre and post field emission of both the sample and the anode (ITO glass metallic plate) with Jobin Yvon LabRam HR800 (See FIG. 19).

Under high vacuum it is possible to transfer patterned carbon nanotubes from the substrate that they are grown on (the cathode) to the opposite electrode: the plus charged anode. This process takes place only for nanoscale size objects, which have electrical conduction as a result of applying a negative bias to the nanotubes. Upon this voltage the electrons are emitted by electric field enhanced on the tips of tubes and fly in vacuum towards positively charged anode. This electronic phenomena is well known as field emission. What is new, is that above certain threshold current, the carbon nanotubes themselves are sublimed and are deposited on the anode. These transferred nanotubes retain the original pattern of nanotubes and their alignment even after being transferred to the anode over the distances of 10 to 500 microns.

The transfer of the vertically aligned multiwalled carbon nanotubes occurs as a result of heating and melting of the Fe catalyst on the substrate, which is necessary for growth. The anode cathode spacing for the transfer is in the range of 10-500 μm depending on the size and height of the nanotubes. The transfer occurs during the emission current in the range of 0.32 mA/cm$^2$ to 10 mA/cm$^2$. The transfer of the nanotubes is accompanied by spark emission occurring as a result I of the melting of the Fe catalyst.

The present invention can be used to fabricate cold electron emitters that can work at low power and low electric fields, particularly for mass spectrometers to be used in space. The usual electron energies required are in the range of 20 to 90 eV and the emission currents should be in the range of 100 to 300 micro amps.

These re-deposited tubes are found to be able to emit electrons in reversed electric fields, which proves, that tubes did not transform to amorphous carbon upon field-induced sublimation. The optical spectra of emitted light are recorded by OMA at different electric fields in the range of 200 V-10 kV (both AC and DC) and have been found to have more complicated form than recently reported blackbody radiation shape for low field DC-field emission. The spectra induced by AC pulsed currents show clear discrete lines, which imply a molecular or atomic origin. The temperature of nanotubes overheated by emission currents can be estimated from light emission spectra. The SEM showed clear signatures of melting of the Si substrate under the spark emitting tubes.

EXPERIMENTAL DETAILS

1. Setup Details:
    A diode configuration was used for making the measurements.
    The pressure inside the vacuum chamber was maintained at $10^{-6}$-$10^{-7}$ Torr.
    The MWNT sample was the cathode and a transparent glass coated with ITO was the anode.
    The Optical Multi channel Analyzer (OMA) was used for measuring the spectra.

Figure 20:
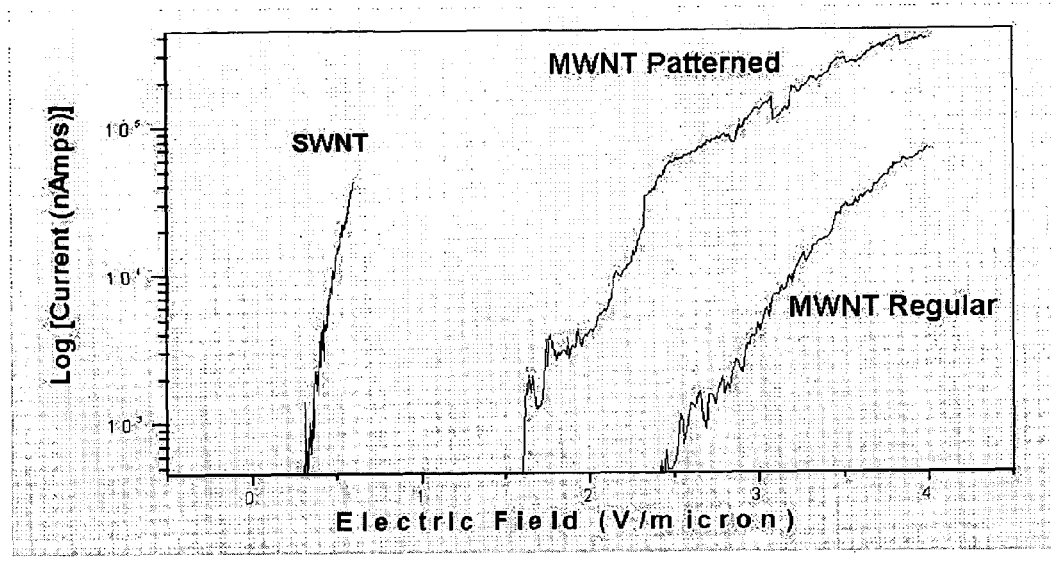
FIG. 20 are Current-Voltage curves I-V curves obtained from regular forests of MWNT and patterned MWNT samples in accordance with the present invention.
Figure 21:
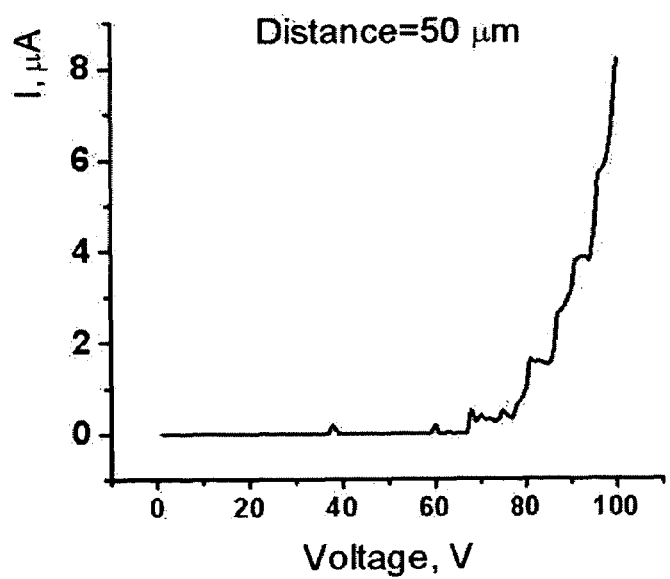
FIG. 21 is a Current-Voltage curve for the ionization chamber used in accordance with the present invention.

2. Preparation of MW-CNT Arrays:
    The well-ordered aligned MWNTs were synthesized by the catalytic thermal chemical vapor deposition (CVD) at the atmospheric pressure on the substrates of n++ Si (100) wafers.
    The length of the carbon nanotubes was adjusted by the variation of the growth time, ranging between 100 and 600 mm. The deposits were characterized by scanning electron microscope (SEM).
    In some of the samples grown, the electron beam lithography was used to define the iron areas.
    Those substrates with a patterned catalyst film yielded patterned growth of MW-CNT "forests" with the same geometry.
    Observations and Results:

1. I-V Curves (See FIGS. 20 and 21):
    I-V curves were obtained from regular forests of MWNT and patterned MWNT samples.
    The patterned MWNT arrays were found to have a lower threshold voltage as compared to the regular MWNT arrays.
    The patterned MWNTs have threshold electric fields of the order of 1.7 V/mm whereas the regular MWNT have a threshold field of 2.5 V/mm.

2. Spark Light Emission: Spark Light Emission was observed when high voltage (both pulsed and DC) were applied to the MWNT samples.
    It was also observed that the emission starts at the edge and moves across the sample. Photographs of the emission are shown in FIGS. 17A and 17B.
    The emission spectra was recorded by the OMA.

Figure 19:
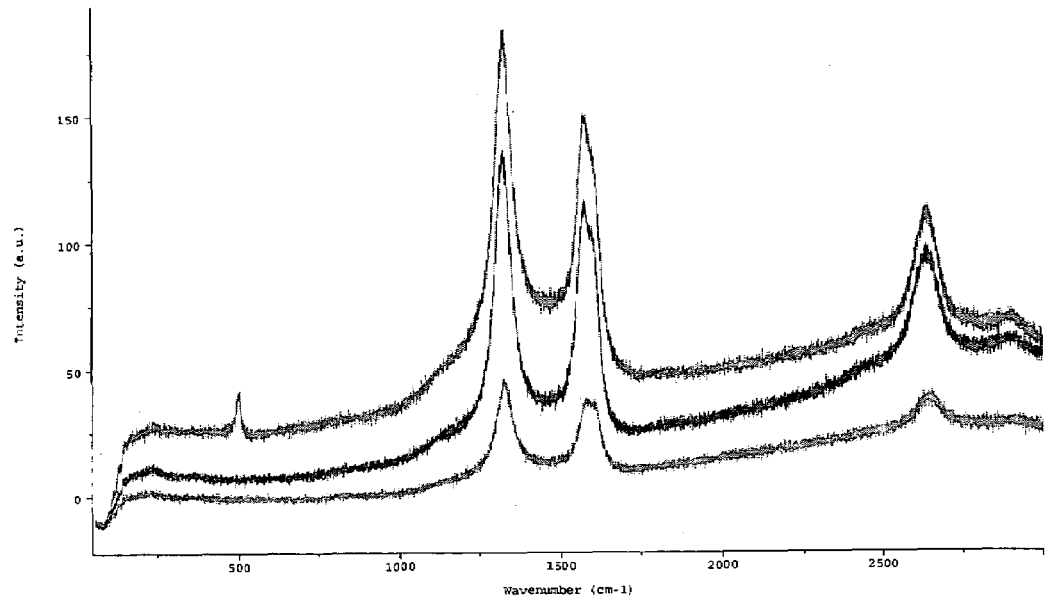
FIG. 19 are Raman Spectra of original (middle) and deposited CNTs (top) in accordance with the present invention.

3. Sublimation and Transfer of MWNTs onto the ITO:

It was also seen that during spark emission sublimation of the nanotubes occurs and the NT's transfer onto the ITO. However it was also observed that when this experiment was performed with patterned MWNT, there is a huge spark and the all of the sample gets deposited onto the ITO at the same time. These NT's retain their alignment and pattern. As shown in FIG. 19, the Raman Spectra of original (middle) and deposited CNTs (top) looks the same.

This sublimation of the tubes leaves craters on the Si wafer.

Discussion: The following three cases can be seen from the OMA images:

Evaporation of Fe (the catalyst) and MWCNT bundles deposition onto anode under the influence of low power pulsed AC.

Evaporation of Fe and C and their discharge under the influence of high power DC.

Sublimation of the nanotubes and the formation of a NT conducting bridge between the cathode and anode resulting in very high temperatures and black body radiation.

Figure 18A:
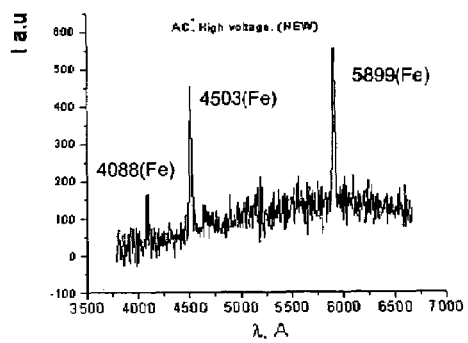
FIGS. 18A, 18B and 18C are spectral emission plots in accordance with the present invention.
Figure 18B:
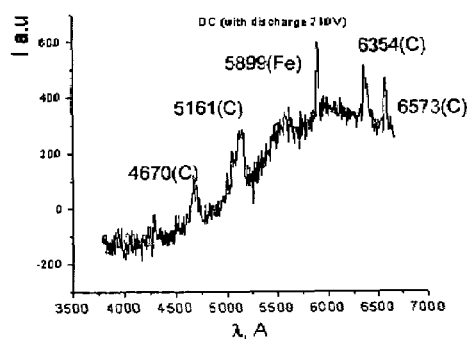
Figure 18C:
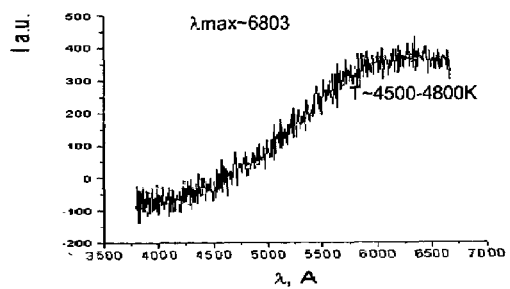

FIGS. 17A and 17B are photographs of the field emission luminescence and FIGS. 18A, 18B and 18C show the field emission luminescence spectra.

Example 1

Growth process of vertically aligned forests of multi walled carbon nanotubes. The well-ordered aligned MWNTs were synthesized by the catalytic thermal chemical vapor deposition (CVD) at the atmospheric pressure. The substrates were n++ Silicon (Si) (100) wafers with a resistivity of 0.005-ohm cm. A 5 nm thick Iron (Fe) film was deposited on the Si wafers by electron beam evaporation or photolithography using a lift-off process. The Fe deposited substrates were placed in the center of a quartz tube (I.D. 45 mm) located in a horizontal tubular electric furnace. The temperature of the substrates was raised at a rate of 15° C./min in a Helium atmosphere. Helium gas of 550 sccm flowed into the quartz tube while the furnace was heated in order to prevent the oxidation of transition metal. After reaching the reaction temperature 680° C., Acetylene gas was introduced into the chamber at the flow rate of 40 sccm. The deposition time was varied from 3 min to 12 min. The length of the carbon nanotubes was adjusted by the variation of the growth time. After the growth process was done, the tube furnace was cooled down to room temperature in Helium ambient. Both pulsed AC and DC fields were used in transfer of these nanotubes onto the anode. The transfer took place as a result of the Fe catalyst melting and vaporizing due to the heat produced as a result of very high currents.

Example 2

Growth of vertically aligned and patterned carbon multi walled nanotubes. In order to grow patterned multi walled carbon nanotubes, the Fe catalyst film deposited on the on the Si substrate was patterned using e-beam photolithography. The size of the pattern could be changed as necessary. The transfer in the case of patterned nanotubes is similar to that of unpatterned aligned nanotubes.

Example 3

Deposition on metallic surfaces. The transfer of the nanotubes can be achieved onto surfaces of conductive materials such as Al or Cu. Since the transfer takes place when the nanotube tips are very hot, they penetrate into the metal surface and lead to a better electrical contact.

Example 4

Deposition on conductive polymers. The transfer of NT can also be done onto a thin layer of polymer and organic matter such as (Alq3), or ITO on metal on plastic. Since the organic layers are very soft, the nanotubes are able to penetrate deep and form excellent electrical and thermal contact.

Example 5

Instead of making strips on the non-conducting material, a mesh or grid can be placed in front of the non-conducting material (either touching the substrate or not touching it). Potential is applied to the mesh and current is also collected on the mesh. If the size of the openings in the mesh are made up of large squares, then the nanotubes can fly through the mesh and get deposited on the non-conducting material. See FIG. 14.

Example 6

It is also possible to transfer the nanotubes onto nonconducting materials by making thin strips of the conducting material on the top of the non-conducting material. The positive potential will be applied to the strips and current will be collected only at the strips but the nanotubes will be transferred and will cover the complete area between strips. FIG. 15 shows the case wherein an OLED was used as the anode. The electrical contact was made to the Al strips while the organic emissive layer of Alq3 (tris-(8-hydroxyquinoline aluminum) is not conductive. However as can be seen nanotube transfer has occurred on both.

Example 7

Deposition of carbon nanotube arrays which can be spinned into yarns of sheets. This example shows that if the original nanotube array on the first surface is high enough and dense enough, then the deposited nanotubes array is also dense enough for spinning from it the yarns and sheets as described by inventors in their recent papers (M. Zhang, et al., Science, 306, 1358 (2004); M. Zhang et al., Science 309, 1215 (2005)), which are hereby incorporated by reference in their entirety. In this example the original MWCNTs forest of 5 by 5 mm area is prepared unpatterned with the height of forest of 300 micron. Deposition is performed on the anode of Al, separated by 500 micron spacing from cathode. The deposited tubes are then tested for drawing a yarn from side of it, and applying twist during drawing following the described technique. Twisted yarn of 1 sm length and 2 micron diameter has been obtained.

Although preferred embodiments of the present invention have been described in detail, it will be understood by those skilled in the art that various modifications can be made therein without departing from the spirit and scope of the invention as set forth in the appended claims.

What is claimed is:

1. A method for transferring an array of oriented carbon nanotubes from a first surface to a second surface comprising the steps of:

providing the array of oriented carbon nanotubes on the first surface within a vacuum chamber;

providing the second surface within the vacuum chamber separate from the first surface; and applying an electric potential between the first surface and the second surface such that the array of oriented carbon nanotubes are sublimed from the first surface and re-deposited on the second surface.

2. The method as recited in claim 1, wherein the array of oriented carbon nanotubes are sublimed when the electron flow through the carbon nanotubes reaches a threshold current.

3. The method as recited in claim 2, wherein the threshold current is between 0.3 mA/cm2 to 10 mA/cm2.

4. The method as recited in claim 2, wherein the threshold current is an alternating current (AC).

5. The method as recited in claim 4, further comprising the step of adjusting the alternating current (AC).

6. The method as recited in claim 5, wherein an electric field created by the electric potential between the first surface and the second surface is pulsed.

7. The method as recited in claim 1, wherein the carbon nanotubes have a length between 20 and 400 microns.

8. The method as recited in claim 1, wherein the carbon nanotubes have a length between 50 and 200 microns.

9. The method as recited in claim 1, wherein the carbon nanotubes have a diameter between 5 and 30 nanometers.

10. The method as recited in claim 1, wherein the carbon nanotubes have a diameter between 10 and 20 nanometers.

11. The method as recited in claim 1, wherein the carbon nanotubes have a wall thickness between 2 and 10 nanometers.

12. The method as recited in claim 1, wherein the carbon nanotubes have a thermal conductivity greater than 10 W/mK.

13. The method as recited in claim 1, wherein the carbon nanotubes have a thermal conductivity between 100 W/mK and 3000 W/mK.

14. The method as recited in claim 1, wherein the carbon nanotubes have an electrical conductivity greater than 103 S/cm.

15. The method as recited in claim 1, wherein the carbon nanotubes have an electrical conductivity between 103 S/cm and 2×104 S/cm.

16. The method as recited in claim 1, wherein the array of oriented carbon nanotubes forms a pattern on the first surface.

17. The method as recited in claim 16, wherein the pattern on the first surface is substantially duplicated on the second surface after the carbon nanotubes are sublimed from the first surface and re-deposited on the second surface.

18. The method as recited in claim 17, wherein the pattern is substantially duplicated without using a mask.

19. The method as recited in claim 17, wherein the pattern is substantially duplicated without using a pre-patterned substrate.

20. The method as recited in claim 1, wherein the electric potential is applied to form an electrical field that causes the array of oriented carbon nanotubes to form a pattern on the second surface.

21. The method as recited in claim 20, wherein the pattern comprises one or more addressable targets.

22. The method as recited in claim 1, wherein the adhesion of the re-deposited carbon nanotubes on the second surface exceeds the adhesion of the carbon nanotubes on the first surface.

23. The method as recited in claim 1, wherein the electrical contact resistance of the re-deposited carbon nanotubes on the second surface is less than 100 ohms.

24. The method as recited in claim 1, wherein the electrical contact resistance of the re-deposited carbon nanotubes on the second surface is substantially less than 10 ohms.

25. The method as recited in claim 1, wherein the first surface and the second surface are oriented vertically, substantially planar, non-planar, substantially parallel to one another or not parallel to one another.

26. The method as recited in claim 1, wherein the first surface and the second surface are separated by a distance of between 10 and 500 microns.

27. The method as recited in claim 1, wherein the first surface is a cylinder and the second surface is a target disposed within the cylinder.

28. The method as recited in claim 27, wherein the array of oriented carbon nanotubes are re-deposited on more than one surface of the target.

29. The method as recited in claim 27, wherein the target is a wire, a second cylinder or a circuit board.

30. The method as recited in claim 1, further comprising the step of adjusting the separation between the first surface and the second surface.

31. The method as recited in claim 1, wherein the second surface comprises gold, indium tin oxide coated glass or fluorinated tin oxide coated glass.

32. The method as recited in claim 1, wherein the first surface is a metallic cathode and the second surface is a metallic anode.

33. The method as recited in claim 32, wherein the metallic cathode and the metallic anode are aluminum.

34. The method as recited in claim 1, wherein the first surface and second surface comprise materials that can be electrically charged.

35. The method as recited in claim 1, wherein the second surface comprises a metallic substrate having a low melting temperature.

36. The method as recited in claim 35, wherein the metallic substrate is aluminum or lead.

37. The method as recited in claim 35, wherein the low melting temperature is less than or equal to 700° C.

38. The method as recited in claim 35, wherein the low melting temperature is less than 200 to 300° C.

39. The method as recited in claim 1, wherein the second surface comprises a metallic substrate that is reactive with acetylene.

40. The method as recited in claim 39, wherein the metallic substrate is bronze, copper or a metal alloy.

41. The method as recited in claim 1, wherein the second surface comprises one or more areas of conductive material and one or more areas of non-conductive material such that the areas of conductive material form a pattern.

42. The method as recited in claim 1, wherein the first surface comprises a first pattern and the second surface comprises a second pattern.

43. The method as recited in claim 42, wherein the first pattern differs from the second pattern.

44. The method as recited in claim 1, further comprising the step of growing the array of oriented carbon nanotubes on the first surface.

45. The method as recited in claim 44, wherein the array of oriented carbon nanotubes are grown using a catalytic thermal chemical vapor deposition process.

46. The method as recited in claim 1, wherein the array of oriented carbon nanotubes are re-deposited on the second surface to form one or more interconnects in an electrical circuit.

47. The method as recited in claim 1, wherein the array of oriented carbon nanotubes are re-deposited on the second surface to form a dense array of nanotubes from which one or more twist yarns can be spun.

48. The method as recited in claim 1, wherein the array of oriented carbon nanotubes are re-deposited on the second surface to form a dense and long array of nanotubes from which one or more transparent nanotube ribbons and sheets can be drawn.

49. The method as recited in claim 1, wherein the array of oriented carbon nanotubes are re-deposited on the second surface to form a portion of a video display, a conductor, a transistor.

50. The method as recited in claim 1, wherein the array of oriented carbon nanotubes are re-deposited on the second surface to form a one or more gated field emission arrays.

51. The method as recited in claim 1, wherein the method is performed a part of a continuous production process.

52. The method as recited in claim 1, further comprising the step of providing a third surface such that the second surface is disposed between the first surface and the third surface and wherein the second surface is porous such that the array of oriented carbon nanotubes are sublimed from the first surface, pass substantially through the second surface and are re-deposited on the third surface.

53. The method as recited in claim 52, wherein the third surface is in physical contact with the second surface.

54. The method as recited in claim 52, wherein the third surface is not in physical contact with the second surface.

55. The method as recited in claim 52, wherein the second surface comprises a wire mesh, one or more wires, one or more strips, or a solid surface having one or more apertures.

56. The method as recited in claim 2, wherein the threshold current is a direct current (DC).

* * * * *